(12) United States Patent  
Yang et al.

(10) Patent No.: US 8,907,720 B2  
(45) Date of Patent: Dec. 9, 2014

(54) CAPACITIVE SWITCH, APPARATUS FOR TRANSCEIVING SIGNAL, AND MANUFACTURING METHOD THEREOF

(71) Applicant: Huawei Device Co., Ltd., Shenzhen (CN)

(72) Inventors: Xiong Yang, Shanghai (CN); Bocheng Cao, Wuhan (CN); Lei Wang, Shenzhen (CN)

(73) Assignee: Huawei Device Co., Ltd., Shenzhen (CN)

( * ) Notice: Subject to any disclaimer, the term of this patent is extended or adjusted under 35 U.S.C. 154(b) by 0 days.

(21) Appl. No.: 14/144,095

(22) Filed: Dec. 30, 2013

(65) Prior Publication Data

US 2014/0285252 A1  Sep. 25, 2014

Related U.S. Application Data

(63) Continuation of application No. PCT/CN2013/072938, filed on Mar. 20, 2013.

(51) Int. Cl.
*H01L 25/00* (2006.01)
*H01H 21/18* (2006.01)
*H01H 11/00* (2006.01)

(52) U.S. Cl.
CPC ............... *H01H 21/18* (2013.01); *H01H 11/00* (2013.01)
USPC ........................................................ 327/565

(58) Field of Classification Search
USPC .......................................... 327/517, 564, 565
See application file for complete search history.

(56) References Cited

U.S. PATENT DOCUMENTS

| | | | | |
|---|---|---|---|---|
| 8,575,995 | B2 * | 11/2013 | Shigetaka | 327/517 |
| 8,754,704 | B2 * | 6/2014 | Huang | 327/565 |
| 2010/0314669 | A1 | 12/2010 | Huang | |

FOREIGN PATENT DOCUMENTS

| | | |
|---|---|---|
| CN | 101924542 A | 12/2010 |
| CN | 201752111 U | 2/2011 |
| EP | 2421153 A1 | 2/2012 |

* cited by examiner

*Primary Examiner* — Hai L Nguyen
(74) *Attorney, Agent, or Firm* — Brinks Gilson & Lione

(57) ABSTRACT

A capacitive switch includes: a first conductive cantilever, a second conductive cantilever, a substrate, a coplanar waveguide arranged on the substrate, the coplanar waveguide includes a first conductor configured to transmit an electrical signal, a second conductor and a third conductor are arranged as ground wires on two sides of the first conductor; an insulation medium layer is arranged on the first conductor, a conducting layer is arranged on the insulation medium layer; the first conductive cantilever is connected to the second conductor by using a first fixed end, the second conductive cantilever is connected to the third conductor by using a second fixed end; when a direct-current signal is transmitted on the capacitive switch, a first free end of the first conductive cantilever and a second free end of the second conductive cantilever contact the conducting layer.

12 Claims, 3 Drawing Sheets

CAPACITIVE SWITCH, APPARATUS FOR TRANSCEIVING SIGNAL, AND MANUFACTURING METHOD THEREOF

CROSS-REFERENCE TO RELATED APPLICATIONS

This application is a continuation of International Application No. PCT/CN2013/072938, filed on Mar. 20, 2013, which is hereby incorporated by reference in its entirety.

TECHNICAL FIELD

The present disclosure relates to communications technologies, and in particular to a capacitive switch, an apparatus for transceiving a signal, and a method for manufacturing the capacitive switch.

BACKGROUND

With continuous development of communications technologies, communications terminals need to support more frequency bands. Here, the communications terminal may be a mobile phone, a data card, or another communications terminal. A communications terminal operating on different networks or in different frequency bands needs to select and switch a frequency band.

An existing communications terminal, when operating, is mainly controlled by chips, such as a transceiving chip. Some pins on these chips may indicate operating frequency bands of the communications terminal. This means that each pin represents a different operating frequency band of the communications terminal. That is, in an integrated circuit of a chip, a capacitive switch is arranged for a pin that corresponds to each operating frequency band of the terminal, and a direct-current signal input from the integrated control circuit is used as a logic level signal, so as to control an on/off state of the capacitive switch to select and switch a frequency band for the communications terminal. A conventional capacitive switch is made by using a micro-electro-mechanical systems MEMS (Micro-Electro-Mechanical Systems) technology, and transmission and cutoff of a signal are controlled by using the direct-current signal that is input from the integrated control circuit as an on/off state control signal of the capacitive switch. That is, when power is supplied to capacitive switches, input signals exist on all of pins that control multiple frequency bands, and a pin that corresponds to each frequency band is connected to a capacitive switch; when the terminal is operating in a certain frequency band, the direct-current signal that is input from the integrated control circuit and driven by a high voltage is sent to control ends of capacitive switches that are connected to pins indicating the other frequency bands; and this direct-current signal controls these capacitive switches to get disconnected, and then a signal input at an input end is cut off. Therefore, a frequency band is selected and switched in this process.

When a conventional capacitive switch selects a frequency band, however, a stress generated by a metal film bridge often cannot be released due to integrity of a double-clamped beam. As a result, the beam bulges or sinks, further causing a poor contact between the beam and a conducting layer. Then in a process of signal transmission, signal leakage often occurs due to the poor contact, thereby causing poor signal transmission quality of the communications terminal.

SUMMARY

In a first aspect, an embodiment of the present invention provides a capacitive switch, including: a first conductive cantilever, a second conductive cantilever, a substrate, and a coplanar waveguide arranged on the substrate, where the coplanar waveguide includes a first conductor configured to transmit an electrical signal and a second conductor and a third conductor that are arranged as ground wires on two sides of the first conductor; an insulation medium layer is arranged on the first conductor, and a conducting layer is arranged on the insulation medium layer; the first conductive cantilever is connected to the second conductor by using a first fixed end of the first conductive cantilever, and the second conductive cantilever is connected to the third conductor by using a second fixed end of the second conductive cantilever; and when a direct-current signal is not transmitted on the capacitive switch, a first free end of the first conductive cantilever and a second free end of the second conductive cantilever hang over the conducting layer; when the direct-current signal is transmitted on the capacitive switch, the first free end of the first conductive cantilever and the second free end of the second conductive cantilever contact the conducting layer.

In a second aspect, an embodiment of the present invention provides an apparatus for transceiving a signal, including: a signal source processing circuit, a microwave processing circuit, an integrated control circuit, and a capacitive switch, where:

the capacitive switch includes: a first conductive cantilever, a second conductive cantilever, a substrate, and a coplanar waveguide arranged on the substrate; the coplanar waveguide includes a first conductor configured to transmit an electrical signal and a second conductor and a third conductor that are arranged as ground wires on two sides of the first conductor; an insulation medium layer is arranged on the first conductor, and a conducting layer is arranged on the insulation medium layer; the first conductive cantilever is connected to the second conductor by using a first fixed end of the first conductive cantilever, and the second conductive cantilever is connected to the third conductor by using a second fixed end of the second conductive cantilever; the signal source processing circuit is connected to an input end arranged on the first conductor of the capacitive switch; the microwave processing circuit is connected to an output end arranged on the first conductor of the capacitive switch; the integrated control circuit is connected to a control end arranged on the first conductor of the capacitive switch; and when a direct-current signal is not transmitted at the control end arranged on the first conductor of the capacitive switch, a first free end of the first conductive cantilever and a second free end of the second conductive cantilever hang over the conducting layer; when the direct-current signal is transmitted at the control end arranged on the first conductor of the capacitive switch, the first free end of the first conductive cantilever and the second free end of the second conductive cantilever contact the conducting layer.

In a third aspect, an embodiment of the present invention provides a method for manufacturing a capacitive switch. The method includes:

coating a metal layer on a face of a substrate, and performing etching to form a coplanar waveguide, where the coplanar waveguide includes a first conductor configured to transmit an electrical signal and a second conductor and a third conductor that are arranged as ground wires on two sides of the first conductor;

coating an insulation medium film on a structure formed by performing etching, and performing etching to form an insulation medium layer, where the insulation medium layer is formed on the first conductor;

coating a conductive film on the structure formed by performing etching, and performing etching to form a conducting layer, where the conducting layer is formed on the insulation medium layer;

coating a sacrificial layer on the structure formed by performing etching, and performing etching to form a sacrificial structure, where edges of the sacrificial structure cover a part of the second conductor and a part of the third conductor;

coating a metal layer on the structure formed by performing etching, and performing etching to form a first conductive cantilever and a second conducive cantilever, where the first conductive cantilever is connected to the second conductor by using a first fixed end of the first conductive cantilever, and the second conductive cantilever is connected to the third conductor by using a second fixed end of the second conductive cantilever; and removing the sacrificial structure.

BRIEF DESCRIPTION OF DRAWINGS

To illustrate the technical solutions in the embodiments of the present invention more clearly, the following briefly introduces the accompanying drawings required for describing the embodiments or the prior art. Apparently, the accompanying drawings in the following description show merely some embodiments of the present invention, and persons of ordinary skill in the art may still derive other drawings from these accompanying drawings without creative efforts.

Figure 1:
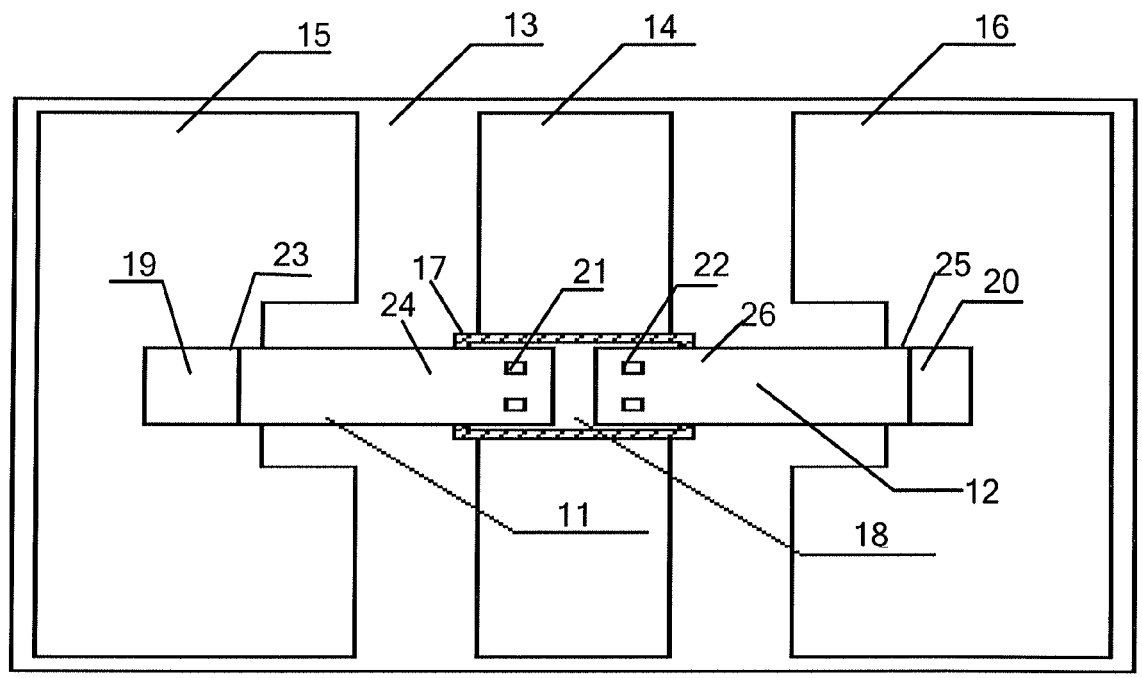
FIG. 1 is a schematic diagram of a top-view structure of a capacitive switch according to a first embodiment of the present invention.

Reference numerals of the accompanying drawings are described as follows:

11: First conductive cantilever    12: Second conductive cantilever    13: Substrate
14: First conductor    15: Second conductor    16: Third conductor
17: Insulation medium layer    18: Conducting layer    19: First fixed end
20: Second fixed end    21: Contact    22: Contact
23: First supporting part    24: First free end    25: Second supporting part
26: Second free end    30: Signal source processing circuit
31: Microwave processing circuit    32: Integrated control circuit    33: Capacitive switch
301: Antenna    302: Filter    303: Circulator
310: Low-noise power amplifier in the art based on the embodiments of the present invention without creative efforts shall fall within the protection scope of the present invention.

Figure 2:
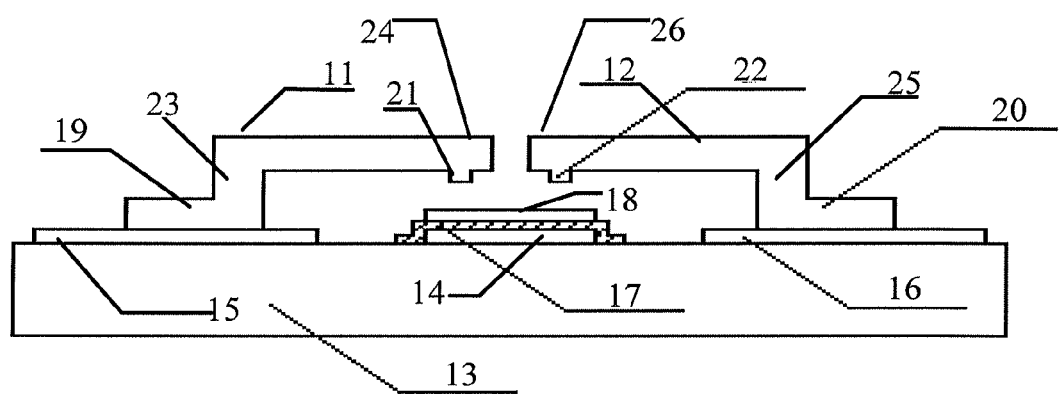
FIG. 2 is a schematic diagram of a sectional structure of a capacitive switch according to a first embodiment of the present invention.

FIG. 1 is a schematic diagram of a top-view structure of a capacitive switch according to a first embodiment of the present invention. FIG. 2 is a schematic diagram of a sectional structure of a capacitive switch according to a first embodiment of the present invention. As shown in FIG. 1 and FIG. 2, the capacitive switch includes: a first conductive cantilever 11, a second conductive cantilever 12, a substrate 13, and a coplanar waveguide arranged on the substrate 13, where the coplanar waveguide includes a first conductor 14 configured to transmit an electrical signal and a second conductor 15 and a third conductor 16 that are arranged as ground wires on two sides of the first conductor 14; an insulation medium layer 17 is arranged on the first conductor 14, and a conducting layer 18 is arranged on the insulation medium layer 17; the first conductive cantilever 11 is connected to the second conductor 15 by using a first fixed end 19 of the first conductive cantilever 11, and the second conductive cantilever 12 is connected to the third conductor 16 by using a second fixed end 20 of the second conductive cantilever 12; and when a direct-current signal is not transmitted on the capacitive switch, a first free end 24 of the first conductive cantilever 11 and a second free end 26 of the second conductive cantilever 12 hang over the conducting layer 18; when the direct-current signal is transmitted on the capacitive switch, the first free end 24 of the first conductive cantilever 11 and the second free end 26 of the second conductive cantilever 12 contact the conducting layer 18.

The electrical signal may be an electromagnetic wave signal or a radio frequency signal.

It should be noted that the first fixed end 19 and the first free end 24 of the first conductive cantilever 11 may form an integrated structure, or may also be separately arranged. That is, one end of the first fixed end 19 is connected to the first free end 24, and this is not limited in this embodiment of the present invention. Similarly, the second fixed end 20 and the second free end 26 of the second conductive cantilever 12 may form an integrated structure, or may also be separately arranged. That is, one end of the second fixed end 20 is connected to the second free end 26, and this is not limited in this embodiment of the present invention.

Specifically, the capacitive switch is initially in an on state, that is, a state in which a signal can be transmitted. The capacitive switch generally includes a first pin, a second pin, and a control pin. Generally, the first pin may be an input pin or an output pin; and correspondingly, the second pin may be an output pin or an input pin. The first pin, the second pin, and the control pin can all be arranged on the first conductor 14 by using an encapsulation and integration technology. The first conductor 14, the insulation medium layer 17, and the con-

DESCRIPTION OF THE EMBODIMENTS

To make the objectives, technical solutions, and advantages of the embodiments of the present invention more comprehensible, the following describes the solutions in the embodiments of the present invention with reference to the accompanying drawings in the embodiments of the present invention. The described embodiments are merely a part rather than all of the embodiments of the present invention. All other embodiments obtained by persons of ordinary skill ducting layer 18 of the capacitive switch form a capacitor structure, which has a function of circulating alternative currents and isolating direct currents (here it is assumed that the first pin is an input pin, and the second pin is an output pin). When the capacitive switch is in the on state, an electrical signal that flows into the first pin of the capacitive switch is an alternative current signal. Then the electrical signal may flow into the first pin of the first conductor 14 and flow out of the second pin, and then a subsequent amplifying circuit processes the signal.

Further, the control pin of the capacitive switch is generally connected to an integrated control circuit. Generally, the capacitive switch is mostly applied in a receive channel. When an electrical signal enters a receive channel of a communications terminal from an antenna and it can be learned by determination performed by a circulator that the electrical signal is a signal received by the antenna after the electrical signal is filtered by a filter, the electrical signal enters an input pin on the first conductor 14 of the capacitive switch. When the communications terminal needs to select and switch a frequency band, that is, when the communications terminal needs to cut off signals of some frequency bands to prevent the signals from flowing into the subsequent amplifying circuit, a direct-current signal is input from the integrated control circuit connected to the control pin of the capacitive switch. The direct-current signal may be used as a logic level signal that controls the on state and an off state of the capacitive switch. Generally, a voltage of the direct-current signal is relatively low and may be insufficient to drive the capacitive switch to the off state. Therefore, a high-voltage driving chip or a high-voltage driving circuit may be arranged inside the integrated control circuit or arranged in a channel through which the integrated control switch and the capacitive switch are connected to each other, so that a voltage of a generated direct-current signal is sufficient to drive the capacitive switch to the off state. When the direct-current signal input from the integrated control circuit flows into the control pin of the capacitive switch after the signal is driven by a high voltage, the first conductor 14 carries positive charges and a face of the conducting layer 18 also carries positive charges, whereas both the second conductor 15 and the third conductor 16 carry negative charges (the second conductor 15 and the third conductor 16 are used as ground wires). Because the second conductor 15 is connected to the first fixed end 19 of the first conductive cantilever 11 and the third conductor 16 is connected to the second fixed end 20 of the second conductive cantilever 12, both the first free end 24 of the first conductive cantilever 11 and the second first free end 26 of the second conductive cantilever 12 carry negative charges. Due to an effect of an electrostatic force generated by attraction between opposite charges, the first free end 24 and the second free end 26 each contact the conducting layer 18 to form two closed loops. When the electrical signal flows into the input pin of the capacitive switch, the electrical signal flows into the second conductor 15 and the third conductor 16 on the left side and the right side through the first conductor 14, the insulation medium layer 17, the conducting layer 18, and the first conductive cantilever 11, and through the first conductor 14, the insulation medium layer 17, the conducting layer 18, and the second conductive cantilever 12. That is, the electrical signal is conducted into the ground wires, so that electrical signals of some frequency bands cannot flow to an output pin on the first conductor 14 of the capacitive switch, thereby enabling the communications terminal to operate in a user-desired operating frequency band.

The first conductive cantilever 11 and the second conductive cantilever 12 are made of metal materials.

Suspension design of the first conductive cantilever 11 and the second conductive cantilever 12, compared with a capacitive switch that uses a double-clamped beam structure in the prior art, enables a stress generated by a metal film bridge to be released. That is, on both the right side of the first free end 24 of the first conductive cantilever 11 and the left side of the second free end 26 of the second conductive cantilever 12, there is a certain space to release the stress generated by the metal film bridge. For the double-clamped beam structure in the prior art, however, due to the integrity of a clamped beam itself (that is, a metal film bridge over a conducting layer is a complete beam), the stress generated by the metal film bridge causes the clamped beam to bulge or sink. As a result, the deformed double-clamped beam poorly contacts the conducting layer 18 when the capacitive switch is in the off state, thereby causing signal leakage in a signal transmission process and affecting signal transmission quality of the entire communications terminal. In addition, parasitic capacitance is relatively large when the capacitive switch that uses the double-clamped beam in the prior art is in the on state, and therefore a relatively large insertion loss is generated; and when the capacitive switch is in the on state, some high-frequency signals cannot flow to a subsequent microwave processing circuit due to an impact of the insertion loss.

The capacitive switch provided in this embodiment uses a structure in which the first conductive cantilever 11 and the second conductive cantilever 12 are separated from each other, so that a stress generated by a metal film bridge in the capacitive switch may be released, thereby improving the reliability of the capacitive switch. In addition, parasitic capacitance may be reduced when the capacitive switch is in an on state, thereby further reducing an insertion loss in the on state and ensuring transmission quality of a signal.

In a second embodiment of the present invention, preferably the first fixed end 19 is vertically connected to the first free end 24 to form the first conductive cantilever 11 with a right-angled bending structure, and the second fixed end 20 is vertically connected to the second free end 26 to form the second conductive cantilever 12 with a right-angled bending structure.

Specifically, the structure of the first conductive cantilever 11 may be in a "⌐" shape, and the structure of the second conductive cantilever 12 may be in a "¬" shape.

It should be noted that the first fixed end 19 and the first free end 24 of the first conductive cantilever 11 may form an integrated structure, or may also be separately arranged. That is, one end of the first fixed end 19 is connected to the first free end 24, and this is not limited in this embodiment of the present invention. Similarly, the second fixed end 20 and the second free end 26 of the second conductive cantilever 12 may form an integrated structure, or may also be separately arranged. That is, one end of the second fixed end 20 is connected to the second free end 26, and this is not limited in this embodiment of the present invention.

Further, in a third embodiment of the present invention, as shown in FIG. 2, preferably the first fixed end 19 is connected to the first free end 24 by using a first supporting part 23 to form the first conductive cantilever 11 with a Z-shaped bending structure, where the first fixed end 19 is parallel to the first free end 24; and the second fixed end 20 is connected to the second free end 26 by using a second supporting part 25 to form the second conductive cantilever 12 with a Z-shaped bending structure, where the second fixed end 20 is parallel to the second free end 26.

Specifically, the structure of the first conductive cantilever 11 may be in a "⌐" shape, and the structure of the second conductive cantilever 12 may be in a "⌐" shape, as shown in FIG. 2.

It should be noted that the first supporting part 23, the first fixed end 19, and the first free end 24 of the first conductive cantilever 11 may form an integrated structure, with the first supporting part 23 being connected to both the first fixed end 19 and the first free end 24; or may be separately arranged. That is, the first supporting part 23 is connected to both the first fixed end 19 and the first free end 24, and this is not limited in this embodiment of the present invention. Similarly, the second fixed end 20, the second supporting part 25, and the second free end 26 of the second conductive cantilever 12 may form an integrated structure, with the second supporting part 25 being connected to both the second fixed end 20 and the second free end 26; or may be separately arranged. That is, the second supporting part 25 is connected to both the second fixed end 20 and the second free end 26, and this is not limited in this embodiment of the present invention.

Further, in a fourth embodiment of the present invention, as shown in FIG. 2, preferably at least one contact 21 is arranged on a face of the first free end 24 of the first conductive cantilever 11, where the face of the first free end 24 of the first conductive cantilever 11 faces the conducting layer 18; and/or at least one contact 22 is arranged on a face of the second free end 26 of the second conductive cantilever 12, where the face of the second free end 26 of the second conductive cantilever 12 faces the conducting layer 18.

Specifically, at least one contact 21 is arranged on a face of the first free end 24 of the first conductive cantilever 11, where the face of the first free end 24 of the first conductive cantilever 11 faces the conducting layer 18; and/or at least one contact 22 is arranged on a face of the second free end 26 of the second conductive cantilever 12, where the face of the second free end 26 of the second conductive cantilever 12 faces the conducting layer 18. For the first conductive cantilever 11 and the second conductive cantilever 12, when the capacitive switch is in the off state, a direct-current signal that flows into the control pin may enable an electrostatic force to be generated between the first conductive cantilever 11 and the conducting layer 18, and an electrostatic force to be generated between the second conductive cantilever 12 and the conducting layer 18, so that the first conductive cantilever 11 and the second conductive cantilever 12 contact the conducting layer 18 through the contact 21 and the contact 22 respectively to form two closed loops. When an electrical signal flows into the input pin of the capacitive switch, the electrical signal flows into the second conductor 15 and the third conductor 16 on the left side and the right side through the first conductor 14, the insulation medium layer 17, the conducting layer 18, and the first conductive cantilever 11, and through the first conductor 14, the insulation medium layer 17, the conducting layer 18, and the second conductive cantilever 12. That is, the electrical signal is conducted into ground wires (the ground wires are the second conductor 15 and the third conductor 16). As a result, electrical signals of some frequency bands cannot flow to the output pin of the capacitive switch, thereby enabling a communications terminal to operate in a user-desired operating frequency band.

In the capacitive switch provided in this embodiment, at least one contact 21 is arranged on a face of the first free end 24 of the first conductive cantilever 11, where the face of the first free end 24 of the first conductive cantilever 11 faces the conducting layer 18; and/or at least one contact 22 is arranged on a face of the second free end 26 of the second conductive cantilever 12, where the face of the second free end 26 of the second conductive cantilever 12 faces the conducting layer 18. In this way, a contact area between the first conductive cantilever 11 and the conducting layer 18, and a contact area between the second conductive cantilever 12 and the conducting layer 18 may be reduced, so that an adhesive force generated when the first conductive cantilever 11 contacts the conducting layer 18 and an adhesive force generated when the second conductive cantilever 12 contacts the conducting layer 18 may be reduced, thereby further avoiding the following problem: If an adhesive force is greater than an electrostatic force generated between the first conductive cantilever 11 and the conducting layer 18 while the capacitive switch is in an off state, or if an adhesive force is greater than an electrostatic force between the second conductive cantilever 12 and the conducting layer 18 while the capacitive switch is in an off state, the capacitive switch cannot smoothly switch between an on state and the off state.

It should be noted that the capacitive switch may be packaged as a chip, where the chip includes an input pin, an output pin, and a control pin. A direct-current signal input from the control pin may enable the capacitive switch to be in an off state due to an effect of the electrostatic forces, so that the first conductive cantilever 11 and the second conductive cantilever 12 may contact the conducting layer 18 to further form two closed loops. That is, electrical signals (electromagnetic wave signals) of some frequency bands may pass through a capacitor that is formed through the first conductor 14, the insulation medium layer 17, and the conducting layer 18, then pass through the first conductive cantilever 11 and the second conductor 15, and are conducted into the ground; and the electrical signals of some frequency bands also pass through a capacitor that is formed through the first conductor 14, the insulation medium layer 17, and the conducting layer 18, then pass through the second conductive cantilever 12 and the third conductor 16, and are conducted into the ground, so that the electrical signals of some frequency bands cannot flow to the output pin, thereby enabling a communications terminal to operate in a user-desired operating frequency band.

Figure 3:
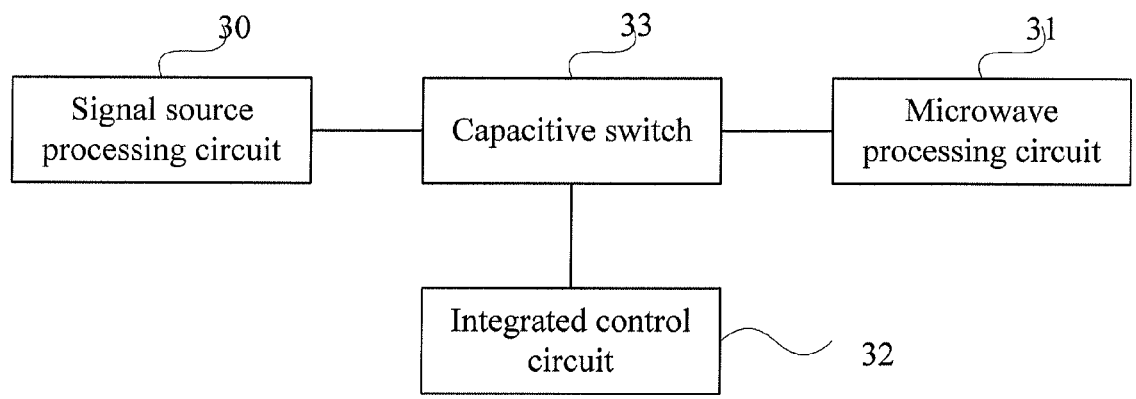
FIG. 3 is a schematic structural diagram of an apparatus for transceiving a signal according to a first embodiment of the present invention.
Figure 4:
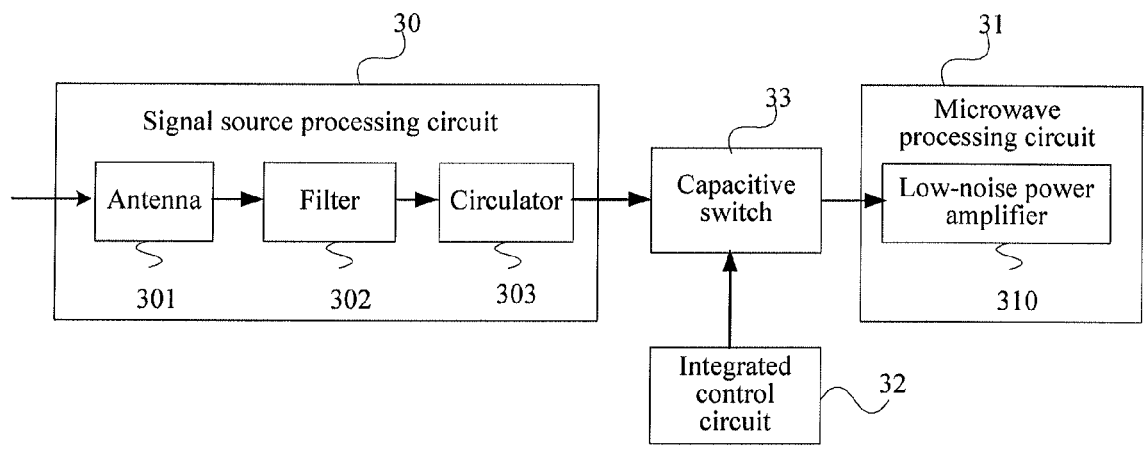
FIG. 4 is a schematic structural diagram of an apparatus for transceiving a signal according to a second embodiment of the present invention.

FIG. 3 is a schematic structural diagram of an apparatus for transceiving a signal according to a first embodiment of the present invention. FIG. 4 is a schematic structural diagram of an apparatus for transceiving a signal according to a second embodiment of the present invention. As shown in FIG. 3, the apparatus includes a signal source processing circuit 30, a microwave processing circuit 31, an integrated control circuit 32, and a capacitive switch 33, where: the signal source processing circuit 30 is connected to an input end arranged on a first conductor 14 of the capacitive switch 33; the microwave processing circuit 31 is connected to an output end arranged on the first conductor 14 of the capacitive switch 33; the integrated control circuit 32 is connected to a control end arranged on the first conductor 14 of the capacitive switch 33; and when a direct-current signal is not transmitted at the control end arranged on the first conductor 14 of the capacitive switch 33, a first free end 24 of the first conductive cantilever 11 and a second free end 26 of the second conductive cantilever 12 hang over the conducting layer 18; when the direct-current signal is transmitted at the control end arranged on the first conductor 14 of the capacitive switch 33, the first free end 24 of the first conductive cantilever 11 contacts the conducting layer 18, and the second free end 26 of the second conductive cantilever 12 contacts the conducting layer 18.

Specifically, as shown in FIG. 4, the signal source processing circuit 30 may include an antenna 301, a filter 302, and a circulator 303, where: an output end of the antenna 301 is connected to an input end of the filter 302, an output end of the filter 302 is connected to an input end of the circulator 303, and an output end of the circulator 303 is connected to the input end arranged on the first conductor 14 of the capacitive switch 33. The microwave processing circuit 31 includes a low-noise power amplifier 310, where the output end arranged on the first conductor 14 of the capacitive switch 33 is connected to an input end of the low-noise power amplifier 310, and an output end of the low-noise power amplifier 310 may be connected to another corresponding device in a receive channel in the prior art. The integrated control circuit 32 is not in the receive channel. The integrated control circuit 32 may be an independent module, and is configured to connect to the control end arranged on the first conductor 14 of the capacitive switch 33 so as to control switching between an on state and an off state of the capacitive switch 33. When a direct-current signal is not transmitted at the control end arranged on the first conductor 14 of the capacitive switch 33, the first free end 24 of the first conductive cantilever 11 and the second free end 26 of the second conductive cantilever 12 hang over the conducting layer 18. When a direct-current signal is transmitted at the control end arranged on the first conductor 14 of the capacitive switch 33, the first free end 24 of the first conductive cantilever 11 contacts the conducting layer 18 and the second free end 26 of the second conductive cantilever 12 contacts the conducting layer 18, so as to further form two closed loops to conduct an electrical signal into a second conductor 15 and a third conductor 16 on the left side and on the right side, so that electrical signals of some frequency bands cannot flow to the output end located on the first conductor 14 of the capacitive switch, thereby enabling a communications terminal to operate on a user-desired operating frequency band. The electrical signal is an electromagnetic wave signal or a radio frequency signal.

For the structure of the capacitive switch 33, reference may be made to FIG. 1, FIG. 2, and the description of the embodiments of the capacitive switch 33, and no further details are provided herein. The apparatus for transceiving a signal may be a communications terminal, such as a data card, a wireless router, a mobile phone, or a media apparatus.

Figure 5:
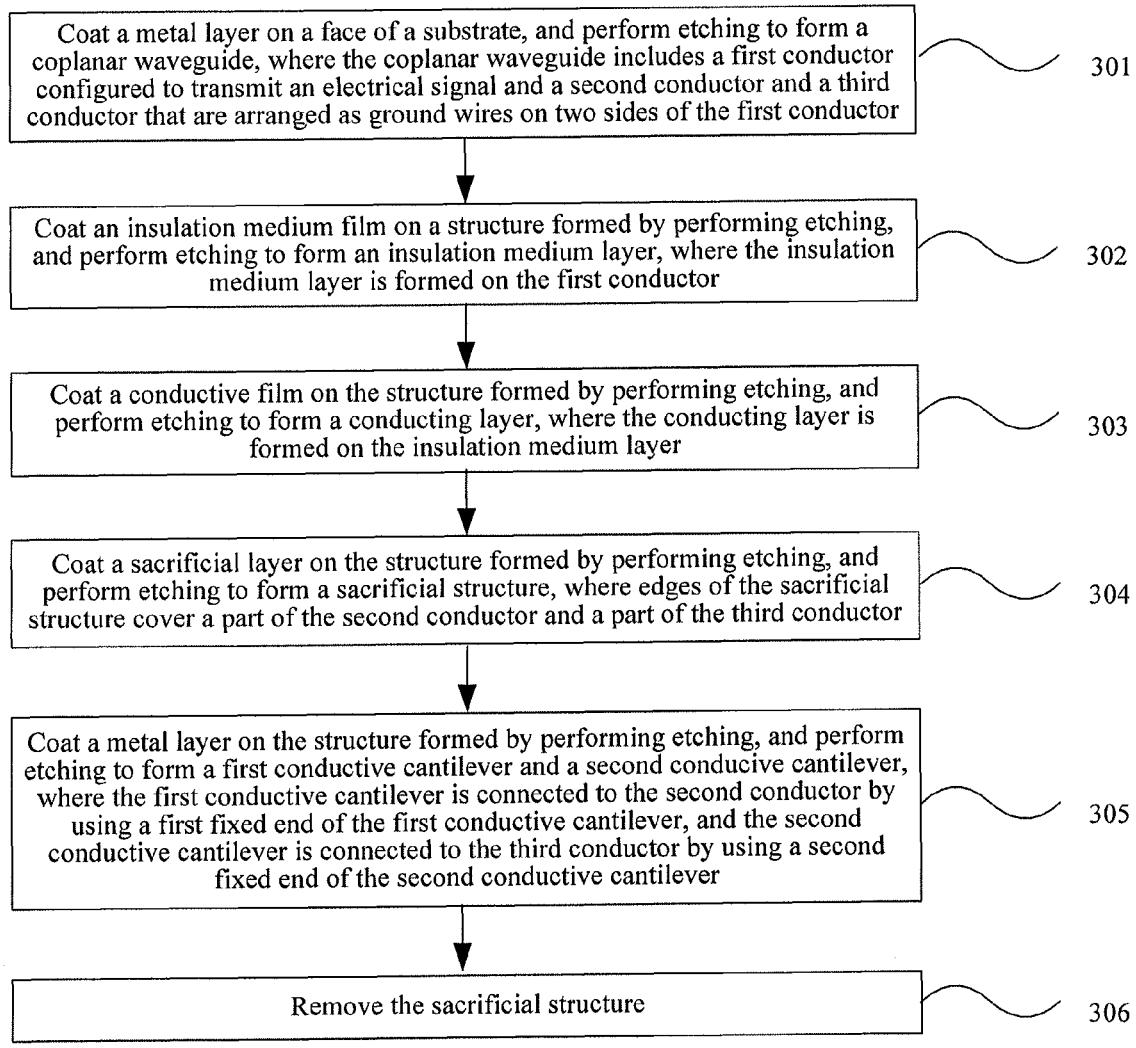
FIG. 5 is a schematic flowchart of a method for manufacturing a capacitive switch according to an embodiment of the present invention.

FIG. 5 is a schematic flowchart of a method for manufacturing a capacitive switch according to an embodiment of the present invention. As shown in FIG. 5, the method includes the following steps:

S301: Coat a metal layer on a face of a substrate, and perform etching to form a coplanar waveguide, where the coplanar waveguide includes a first conductor configured to transmit an electrical signal and a second conductor and a third conductor that are arranged as ground wires on two sides of the first conductor.

The face of the substrate refers to an upper face of the substrate.

Specifically, a metal layer is coated on the face of the substrate. The substrate may be a low-loss substrate with a relatively low dielectric constant. A layer of metal is sputtered on the low-loss substrate, and, by using an etching technology, the unnecessary metal layer is removed by performing etching so as to form a coplanar waveguide, where the coplanar waveguide includes a first conductor configured to transmit an electrical signal and a second conductor and a third conductor that are arranged as ground wires on two sides of the first conductor.

S302: Coat an insulation medium film on a structure formed by performing etching, and perform etching to form an insulation medium layer, where the insulation medium layer is formed on the first conductor.

Specifically, on a face of the first conductor, a face of the second conductor, and a face of the third conductor that are formed by performing etching, and on faces of gaps between the first conductor, the second conductor, and the third conductor, a plasma enhanced chemical vapor deposition method (Plasma Enhanced Chemical Vapor Deposition, PECVD for short) is applied so as to generate an entire layer of insulation medium film; and the insulation medium film is etched by using the etching technology to form an insulation medium layer, where the insulation medium layer is formed on the first conductor. There is no insulation medium film on the faces of the second conductor and the third conductor because the etching technology is used.

S303: Coat a conductive film on the structure formed by performing etching, and perform etching to form a conducting layer, where the conducting layer is formed on the insulation medium layer.

Specifically, on the face of the second conductor, the face of the third conductor, and the face of the insulation medium layer on the face of the first conductor that are formed by performing etching, and on faces of gaps between the second conductor, the third conductor, and the insulation medium layer on the face of the first conductor, an entire layer of conductive film is coated; and the conductive film is etched by using the etching technology to form a conducting layer, where the conducting layer is formed on the insulation medium layer, and the conductive film on the second conductor and the conductive film on the third conductor are already removed by performing etching.

S304: Coat a sacrificial layer on the structure formed by performing etching, and perform etching to form a sacrificial structure, where edges of the sacrificial structure cover a part of the second conductor and a part of the third conductor.

Specifically, an entire sacrificial layer is coated on the structure formed by performing etching in step 303, and the sacrificial layer is etched to form a sacrificial structure, where edges of the sacrificial structure cover a part of the second conductor and a part of the third conductor. That is, after the sacrificial layer is coated, a fixed area of a first fixed end and a fixed area of a second fixed end are formed by performing etching by using the etching technology; the fixed area of the first fixed end lies in a middle part of the second conductor, that is, the sacrificial layer is removed from the area of the first fixed end by performing etching and the sacrificial layer exists on all edges of the fixed area of the first fixed end (that is, the edges of the sacrificial structure cover a part of the second conductor); and similarly, the sacrificial layer exists on all edges of the fixed area of the second fixed end (that is, the edges of the sacrificial structure cover a part of the third conductor). A sacrificial layer is coated between the second conductor and the third conductor.

S305: Coat a metal layer on the structure formed by performing etching, and perform etching to form a first conductive cantilever and a second conducive cantilever, where the first conductive cantilever is connected to the second conductor by using the first fixed end of the first conductive cantilever, and the second conductive cantilever is connected to the third conductor by using the second fixed end of the second conductive cantilever.

S306: Remove the sacrificial structure.

The sacrificial structure is removed to form a first free end of the first conductive cantilever and a second free end of the second conductive cantilever.

Specifically, an entire metal layer (here, the entire metal layer is coated in a sputtering manner) is coated on the structure formed by performing etching in step 304; the first conductive cantilever and the second conductive cantilever are formed by performing etching; after the first conductive cantilever and the second conductive cantilever are formed by performing etching, metal is sputtered layer by layer, that is, electroplating is performed to increase a thickness, where the first conductive cantilever is connected to the second conductor by using the first fixed end of the first conductive cantilever, and the second conductive cantilever is connected to the third conductor by using the second fixed end of the second conductive cantilever; and then the sacrificial structure is removed by using a wet etching method, so as to form the first free end of the first conductive cantilever, the second free end of the second conductive cantilever, the first fixed end, and the second fixed end, where a connection between the first fixed end and the second conductor and a connection between the second fixed end and the third conductor may be implemented by using a sputtering technology.

In the method provided in this embodiment, a structure in which a first conductive cantilever and a second conductive cantilever are separated from each other is formed by using an etching technology, so that a stress generated by a metal film bridge in a capacitive switch may be released, thereby improving reliability of the capacitive switch. In addition, parasitic capacitance may be reduced when the capacitive switch is in an on state, thereby further reducing an insertion loss in the on state and ensuring transmission quality of a signal.

On a basis of the embodiment shown in FIG. 5, preferably step 305 may be: coating a metal layer on the structure formed by performing etching, and performing etching to form the first conductive cantilever and the second conducive cantilever, where the first fixed end is vertically connected to the first free end to form the first conductive cantilever with a right-angled bending structure, and the second fixed end is vertically connected to the second free end to form the second conductive cantilever with a right-angled bending structure.

Specifically, the structure formed by performing etching in step 304 includes the fixed area of the first fixed end and the fixed area of the second fixed end, and sacrificial layers on faces of the fixed area of the first fixed end and the fixed area of the second fixed end are removed by performing etching; a metal layer (here the entire metal layer may be coated in a sputtering manner) is coated on a basis of the structure, and the first conductive cantilever and the second conductive cantilever are formed by using the etching technology. In the formed structure, the first fixed end is vertically connected to the first free end to form the first conductive cantilever with a right-angled bending structure, and the second fixed end is vertically connected to the second free end to form the second conductive cantilever with a right-angled bending structure. It should be noted that the structure of the first conductive cantilever may be in a "⌐" shape, and the formed structure of the second conductive cantilever may be in a "⌐" shape.

On a basis of the embodiment shown in FIG. 5, preferably step 305 may be: coating a metal layer on the structure formed by performing etching, and performing etching to form the first conductive cantilever and the second conducive cantilever, where the first fixed end is connected to the first free end by using a first supporting part to form the first conductive cantilever with a Z-shaped bending structure, and the first fixed end is parallel to the first free end; and the second fixed end is connected to the second free end by using a second supporting part to form the second conductive cantilever with a Z-shaped bending structure, and the second fixed end is parallel to the second free end.

Specifically, the structure formed by performing etching in step 304 includes the fixed area of the first fixed end and the fixed area of the second fixed end, and sacrificial layers on faces of the fixed area of the first fixed end and the fixed area of the second fixed end are removed by performing etching; a metal layer (here the entire metal layer may be coated in a sputtering manner) is coated on a basis of the structure, and the first conductive cantilever and the second conductive cantilever are formed by using the etching technology. In the formed structure, the first fixed end is connected to the first free end by using the first supporting part to form the first conductive cantilever with a Z-shaped bending structure, and the first fixed end is parallel to the first free end; and the second fixed end is connected to the second free end by using the second supporting part to form the second conductive cantilever with a Z-shaped bending structure, and the second fixed end is parallel to the second free end. It should be noted that the formed structure of the first conductive cantilever may be in a "⌐" shape, and the formed structure of the second conductive cantilever may be in a "⌐" shape.

On a basis of the embodiment shown in FIG. 5, preferably in step 304, at least one contact receiving area of the first conductive cantilever and/or at least one contact receiving area of the second conductive cantilever are further formed on a face of the sacrificial layer structure; and accordingly, after the sacrificial structure is removed, at least one contact is further formed on a face of the first free end of the first conductive cantilever, where the face of the first free end of the first conductive cantilever faces the conducting layer; and/or at least one contact is further formed on a face of the second free end of the second conductive cantilever, where the face of the second free end of the second conductive cantilever faces the conducting layer.

Specifically, on a face of the sacrificial layer, the fixed area of the first fixed end and the fixed area of the second fixed end are formed by performing etching as described in step 304, and the at least one contact receiving area of the first conductive cantilever and the at least one contact receiving area of the second conductive cantilever are further formed on the face of the sacrificial layer; and preferably, a face of the sacrificial layer that faces the free end of the first conductive cantilever may be selected for etching to form two contact receiving areas, and/or a face of the sacrificial layer that faces the free end of the second conductive cantilever may be selected for etching to form two contact receiving areas.

After the sacrificial structure is removed by using the wet etching method, at least one contact is further formed on a face of the first free end of the first conductive cantilever, where the face of the first free end of the first conductive cantilever faces the conducting layer; and/or at least one contact is further formed on a face of the second free end of the second conductive cantilever, where the face of the second free end of the second conductive cantilever faces the conducting layer. Preferably, there may be two contacts on a face of a free end of each conductive cantilever, where the face of the free end of the conductive cantilever faces the conducting layer face.

In the method provided in this embodiment, a structure in which a first conductive cantilever and a second conductive cantilever are separated from each other is formed by using an etching technology, so that a stress generated by a metal film bridge in a capacitive switch may be released, thereby improving reliability of the capacitive switch. In addition, parasitic capacitance may be reduced when the capacitive switch is in an on state, thereby further reducing an insertion loss in the on state and ensuring transmission quality of a signal. Furthermore, contacts are formed on a face of the first conductive cantilever and on a face of the second conductive cantilever, where the face of the first conductive cantilever and the face of the second conductive cantilever face a conducting layer. In this way, a contact area between the first conductive cantilever and the conducting layer, and a contact area between the second conductive cantilever and the conducting layer may be reduced, so that an adhesive force generated when the first conductive cantilever contacts the conducting layer and an adhesive force generated when the second conductive cantilever contacts the conducting layer may be reduced, thereby further avoiding the following problem: If an adhesive force is greater than an electrostatic force generated between the first conductive cantilever and the conducting layer while the capacitive switch is in an off state, or if an adhesive force is greater than an electrostatic force between the second conductive cantilever and the conducting layer while the capacitive switch is in an off state, the capacitive switch cannot smoothly switch between an on state and an off state.

Finally, it should be noted that the foregoing embodiments are merely intended for describing the technical solutions of the present invention other than limiting the present invention. Although the present invention is described in detail with reference to the foregoing embodiments, persons of ordinary skill in the art should understand that they may still make modifications to the technical solutions described in the foregoing embodiments, or make equivalent replacements to some or all the technical features thereof, without departing from the spirit and scope of the technical solutions of the embodiments of the present invention.

What is claimed is:

1. A capacitive switch, comprising:
a first conductive cantilever,
a second conductive cantilever,
a substrate, and
a coplanar waveguide arranged on the substrate,
wherein:
   the coplanar waveguide comprises a first conductor configured to transmit an electrical signal and a second conductor and a third conductor that are arranged as ground wires on two sides of the first conductor;
   an insulation medium layer is arranged on the first conductor, and
   a conducting layer is arranged on the insulation medium layer;
   the first conductive cantilever is connected to the second conductor by using a first fixed end of the first conductive cantilever, and the second conductive cantilever is connected to the third conductor by using a second fixed end of the second conductive cantilever; and
when a direct-current signal is not transmitted on the capacitive switch, a first free end of the first conductive cantilever and a second free end of the second conductive cantilever hang over the conducting layer; when the direct-current signal is transmitted on the capacitive switch, the first free end of the first conductive cantilever and the second free end of the second conductive cantilever contact the conducting layer.

2. The capacitive switch according to claim 1, wherein the first fixed end is vertically connected to the first free end to form the first conductive cantilever with a right-angled bending structure, and the second fixed end is vertically connected to the second free end to form the second conductive cantilever with a right-angled bending structure.

3. The capacitive switch according to claim 1, wherein the first fixed end is connected to the first free end by using a first supporting part to form the first conductive cantilever with a Z-shaped bending structure, and the first fixed end is parallel to the first free end; and the second fixed end is connected to the second free end by using a second supporting part to form the second conductive cantilever with a Z-shaped bending structure, and the second fixed end is parallel to the second free end.

4. The capacitive switch according to claim 1, wherein at least one contact is arranged on a face of the first free end of the first conductive cantilever, and the face of the first free end of the first conductive cantilever faces the conducting layer; and
at least one contact is arranged on a face of the second free end of the second conductive cantilever, and the face of the second free end of the second conductive cantilever faces the conducting layer.

5. An apparatus for transceiving a signal, comprising: a signal source processing circuit, a microwave processing circuit, an integrated control circuit, and a capacitive switch, wherein:
the capacitive switch comprises a first conductive cantilever, a second conductive cantilever, a substrate, and a coplanar waveguide arranged on the substrate;
the coplanar waveguide comprises a first conductor configured to transmit an electrical signal and a second conductor and a third conductor that are arranged as ground wires on two sides of the first conductor;
wherein:
an insulation medium layer is arranged on the first conductor, and
a conducting layer is arranged on the insulation medium layer;
   the first conductive cantilever is connected to the second conductor by using a first fixed end of the first conductive cantilever, and the second conductive cantilever is connected to the third conductor by using a second fixed end of the second conductive cantilever;
   the signal source processing circuit is connected to an input end arranged on the first conductor of the capacitive switch;
   the microwave processing circuit is connected to an output end arranged on the first conductor of the capacitive switch;
   the integrated control circuit is connected to a control end arranged on the first conductor of the capacitive switch; and
   when a direct-current signal is not transmitted at the control end arranged on the first conductor of the capacitive switch, a first free end of the first conductive cantilever and a second free end of the second conductive cantilever hang over the conducting layer; when the direct-current signal is transmitted at the control end arranged on the first conductor of the capacitive switch, the first free end of the first conductive cantilever contacts the conducting layer, and the second free end of the second conductive cantilever contacts the conducting layer.

6. The apparatus according to claim 5, wherein the first fixed end is vertically connected to the first free end to form the first conductive cantilever with a right-angled bending structure, and the second fixed end is vertically connected to the second free end to form the second conductive cantilever with a right-angled bending structure.

7. The apparatus according to claim 5, wherein the first fixed end is connected to the first free end by using a first supporting part to form the first conductive cantilever with a Z-shaped bending structure, and the first fixed end is parallel to the first free end; and the second fixed end is connected to the second free end by using a second supporting part to form the second conductive cantilever with a Z-shaped bending structure, and the second fixed end is parallel to the second free end.

8. The apparatus according to claim 5, wherein at least one contact is arranged on a face of the first free end of the first conductive cantilever, and the face of the first free end of the first conductive cantilever faces the conducting layer; and at least one contact is arranged on a face of the second free end of the second conductive cantilever, and the face of the second free end of the second conductive cantilever faces the conducting layer.

9. A method for manufacturing a capacitive switch, comprising:

coating a metal layer on a face of a substrate, and performing etching to form a coplanar waveguide, wherein the coplanar waveguide comprises a first conductor configured to transmit an electrical signal and a second conductor and a third conductor that are arranged as ground wires on two sides of the first conductor;

coating an insulation medium film on the structure formed by performing etching, and performing etching to form an insulation medium layer, wherein the insulation medium layer is formed on the first conductor;

coating a conductive film on the structure formed by performing etching, and performing etching to form a conducting layer, wherein the conducting layer is formed on the insulation medium layer;

coating a sacrificial layer on the structure formed by performing etching, and performing etching to form a sacrificial structure, wherein edges of the sacrificial structure cover a part of the second conductor and a part of the third conductor;

coating a metal layer on the structure formed by performing etching, and performing etching to form a first conductive cantilever and a second conducive cantilever, wherein the first conductive cantilever is connected to the second conductor by using a first fixed end of the first conductive cantilever, and the second conductive cantilever is connected to the third conductor by using a second fixed end of the second conductive cantilever; and removing the sacrificial structure.

10. The method according to claim 9, wherein the coating a metal layer on the structure formed by performing etching and performing etching to form a first conductive cantilever and a second conducive cantilever comprise:

coating the metal layer on the structure formed by performing etching, and performing etching to form the first conductive cantilever and the second conducive cantilever, wherein the first fixed end is vertically connected to a first free end to form the first conductive cantilever with a right-angled bending structure, and the second fixed end is vertically connected to a second free end to form the second conductive cantilever with a right-angled bending structure.

11. The method according to claim 9, wherein the coating a metal layer on the structure formed by performing etching and performing etching to form a first conductive cantilever and a second conducive cantilever comprise:

coating the metal layer on the structure formed by performing etching, and performing etching to form the first conductive cantilever and the second conducive cantilever, wherein the first fixed end is connected to a first free end by using a first supporting part to form the first conductive cantilever with a Z-shaped bending structure, and the first fixed end is parallel to the first free end; and the second fixed end is connected to a second free end by using a second supporting part to form the second conductive cantilever with a Z-shaped bending structure, and the second fixed end is parallel to the second free end.

12. The method according to claim 9, wherein at least one contact receiving area of the first conductive cantilever and at least one contact receiving area of the second conductive cantilever is further formed on a face of the sacrificial layer structure; and accordingly, after the sacrificial structure is removed, at least one contact is further formed on a face of the first free end of the first conductive cantilever, and the face of the first free end of the first conductive cantilever faces the conducting layer; and at least one contact is further formed on a face of the second free end of the second conductive cantilever, and the face of the second free end of the second conductive cantilever faces the conducting layer.

* * * * *